US012562702B2

(12) United States Patent
Tangredi et al.

(10) Patent No.: US 12,562,702 B2
(45) Date of Patent: Feb. 24, 2026

(54) ANALOG FRONT-END ARCHITECTURE FOR CAPACITIVE PRESSURE SENSOR

(71) Applicant: Robert Bosch GmbH, Stuttgart (DE)

(72) Inventors: Domenico Tangredi, Milan (IT); Filippo David, Milan (IT); Gabriele Cazzaniga, Rosate (IT); Manuel Salvatore Santoro, Milan (IT); Massimiliano Musazzi, Como (IT)

(73) Assignee: ROBERT BOSCH GMBH, Stuttgart (DE)

( * ) Notice: Subject to any disclaimer, the term of this patent is extended or adjusted under 35 U.S.C. 154(b) by 436 days.

(21) Appl. No.: 18/258,762

(22) PCT Filed: Dec. 13, 2021

(86) PCT No.: PCT/EP2021/085347
§ 371 (c)(1),
(2) Date: Jun. 21, 2023

(87) PCT Pub. No.: WO2022/148603
PCT Pub. Date: Jul. 14, 2022

(65) Prior Publication Data
US 2024/0120894 A1 Apr. 11, 2024

(30) Foreign Application Priority Data
Jan. 5, 2021 (DE) ..................... 10 2021 200 022.3

(51) Int. Cl.
*H03F 3/45* (2006.01)
*G01L 9/12* (2006.01)

(52) U.S. Cl.
CPC ............ *H03F 3/45475* (2013.01); *G01L 9/12* (2013.01); *H03F 2200/294* (2013.01)

(58) Field of Classification Search
CPC .......... H03F 3/45475; H03F 3/70; H03F 3/72; H03F 3/45; H03F 1/34; G01L 1/144; G01L 9/12; G01D 5/24; H03M 1/124
(Continued)

(56) References Cited

U.S. PATENT DOCUMENTS

| | | | | |
|---|---|---|---|---|
| 2009/0115522 A1* | 5/2009 | Lyden | ..................... | H03F 3/387 330/258 |
| 2015/0276530 A1* | 10/2015 | McTighe | .............. | G01L 9/0072 73/724 |

(Continued)

FOREIGN PATENT DOCUMENTS

| | | |
|---|---|---|
| DE | 102020203036 A1 | 9/2021 |
| EP | 2966456 B1 | 8/2018 |

OTHER PUBLICATIONS

International Search Report for PCT/EP2021/085347, Issued Apr. 8, 2022.

(Continued)

*Primary Examiner* — Stephen E. Jones
(74) *Attorney, Agent, or Firm* — NORTON ROSE FULBRIGHT US LLP

(57) ABSTRACT

An analog front-end architecture for a capacitive pressure sensor with a low-noise amplifier unit for amplification of sensor signals from the sensor. The amplifier unit includes first and second integrator units for integrating charges injected into input terminals of the amplifier unit and for outputting integrated charges to output terminals of the amplifier unit, a feedback unit, and a startup unit. The feedback unit reinjects integrated charges from the integrator unit into the input terminals of the amplifier unit. The startup unit is switchable between first and second switching states and is configured, in the first switching state, to route the charges injected into the input terminals past the first integrator unit into the second integrator unit and from the (Continued)

second integrator unit into the feedback unit, and, in the second switching state, to route charges injected into the input terminals directly into the first integrator unit.

9 Claims, 6 Drawing Sheets

(58) Field of Classification Search
USPC ....................................................... 330/9, 51
See application file for complete search history.

(56) References Cited

U.S. PATENT DOCUMENTS

2016/0011014 A1    1/2016  Entringer et al.
2024/0019320 A1*  1/2024  Tangredi ................. G01L 1/144

OTHER PUBLICATIONS

Chiang et al., "A CMOS MEMS Audio Transducer Implemented By Silicon Condenser Microphone With Analog Front-End Circuits of Audio CODEC," IEEE Transactions On Very Large Scale Integration (VLSI) Systems, vol. 20, No. 9, 2012, pp. 1656-1667. <https://sci-hub.ru/10.1109/tvlsi.2011.2160746> Downloaded Jun. 21, 2023.

Lanniel et al., "Noise Analysis of Charge-Balanced Readout Circuits for MEMS Accelerometers," IEEE Transactions On Circuits and Systems I: Regular Papers, vol. 68, No. 1, 2020, pp. 175-184. <https://sci-hub.ru/10.1109/tcsi.2020.3034159> Downloaded Jun. 21, 2023.

Chai et al., "118-DB Dynamic Range, Continuous-Time, Opened-Loop Capactance To Voltage Converter Readout for Capacitive MEMS Accelerometer," 2010 IEEE Asian Solid State Circuits Conference (A-SSCC), 2010, pp. 1-4. <https://sci-hub.ru/10.1109/asscc.2010.5716626> Downloaded Jun. 21, 2023.

* cited by examiner

ANALOG FRONT-END ARCHITECTURE FOR CAPACITIVE PRESSURE SENSOR

FIELD

The present invention relates to an analog front-end architecture for a capacitive pressure sensor.

BACKGROUND INFORMATION

Pressure sensors are widely used in automotive and consumer applications. Pressure sensors based on piezoresistive materials have been used in the past. In recent times, capacitive pressure sensors based on microelectromechanical systems (MEMS) have been becoming increasingly popular. Their massive deployment in smartphones, smartwatches, wearables, and IoT takes advantage of their key benefits, namely optimization of noise and power consumption together with improved TCO performance. MEMS sensors are used together with an electronic interface circuit which enables correct measurement of the measured pressure. Analog sensor systems are usually connected to digital systems using analog front-end architectures, AFE, which serve to amplify the sensor signals and enable conversion of the analog sensor signals into digital signals. In most AFE architectures for MEMS sensors, the first amplifier is the most critical block in terms of noise and power. Conventional solutions use capacitive feedback amplifiers to detect the differential charge flowing from the sampling capacitors in response to a drive voltage pulse. Conventional solutions use linear capacitive feedback amplifiers configured as charge-to-voltage converters. Due to the high bandwidth of the charge-to-voltage converter, such a simple architecture suffers from output noise aliasing as a result of sampling by the downstream analog-to-digital converter, which is necessary for a low residual error in transient response.

An object of the present invention is to provide an improved analog front-end architecture for a capacitive pressure sensor.

This object may be achieved by the method and the system according to the present invention. Advantageous configurations of the present invention are disclosed herein.

One aspect of the present invention provides an analog front-end architecture for a capacitive pressure sensor with a low-noise amplifier unit for low-noise amplification of sensor signals from the capacitive pressure sensor, wherein the low-noise amplifier unit comprises a first integrator unit and a second integrator unit for integrating charges injected into input terminals of the low-noise amplifier unit and for outputting integrated and amplified voltage signals to output terminals of the low-noise amplifier unit, a feedback unit, and a startup unit, wherein the feedback unit is configured to inject charges proportional to the amplified voltage of the integrator unit into the input terminals of the low-noise amplifier unit, and wherein the startup unit is switchable between a first switching state and a second switching state and is configured, in the first switching state, to route the charge signals injected into the input terminals past the first integrator unit into the second integrator unit and from the second integrator unit into the feedback unit, and, in the second switching state, to route charges injected into the input terminals directly into the first integrator unit.

In this way, it is possible to achieve the technical advantage that an improved analog front-end architecture for capacitive pressure sensors which enables accelerated startup behavior can be provided. In pressure sensors which, as a result of slight pressure changes, for example when measuring atmospheric pressure, are not operated continuously but instead are alternately switched between standby and operating modes, charge signals of the pressure sensor can suddenly be injected into the input terminals of the low-noise amplifier unit of the analog front-end architecture when the pressure sensor is switched into operating mode. This abrupt increase in the charge values applied to the terminals and the associated voltages can delay settling of the integrator units, in particular of the first integrator unit. The startup unit can bypass the first integrator unit in order to accelerate the transient response of the integrator units on starting up the capacitive pressure sensor, such that the charges or voltages applied by the started-up capacitive pressure sensor to the input terminals of the low-noise amplifier unit are introduced directly into the second integrator unit, bypassing the first integrator unit.

The charges integrated by the second integrator unit are thereupon introduced into the feedback unit, which injects the charges proportional to the integrated voltage signals into the input terminals of the low-noise amplifier unit. Thus, by injecting charges proportional to the integrated charges into the input terminals through the feedback unit, it is possible to maintain a voltage applied to the terminals at a desired operating value of the low-noise amplifier unit for upcoming amplification cycles and signals from the pressure sensor. The startup unit may here remain in the first switching state until the charge injected by the feedback unit into the input terminals corresponds to the charges injected by the pressure sensor, whereby charge differences between the signals output by the pressure sensor and the charges injected by the feedback unit into the input terminals converge to zero.

As soon as the difference between the charges injected by the pressure sensor and the charges injected by the feedback unit into the input terminals has converged to zero or a predetermined limit value, the startup unit can be switched into the second switching state, whereby the voltage signals or charges applied to the input terminals of the low-noise amplifier unit are directly introduced into the first integrator unit. The charges injected into the input terminals of the low-noise amplifier unit can subsequently be optimally integrated by the first and second integrator units, whereby optimum amplification behavior of the low-noise amplifier unit is enabled. By starting up the pressure sensor into operating mode, the startup unit can thus minimize the settling time of the first and second integrator units in the event of abrupt injection of the signal charges from the pressure sensor.

According to one example embodiment of the present invention, the first integrator unit takes the form of a boxcar integrator and is configured to integrate the charges injected into the input terminals of the low-noise amplifier unit according to a boxcar integration technique.

This may achieve a technical advantage that an analog front-end architecture with improved noise and power performance can be provided by applying the boxcar integration technique. This results in increased stability and repeatability of the transfer of pressure signals into appropriately amplified voltage signals through the analog front-end architecture. Moreover, increased accuracy of the analog front-end architecture in converting the pressure signals from the pressure sensor into corresponding voltage signals can be achieved.

According to one example embodiment of the present invention, the feedback unit comprises at least one feedback capacitor element, wherein the charges of the second integrator unit injected back into the low-noise amplifier unit are matchable via the feedback capacitor element to the charge signals of a capacitive pressure sensor connected to the input terminals of the low-noise amplifier unit.

In this way, over a plurality of integration cycles of the low-noise amplifier unit, the charge injected via the feedback unit into the input terminals of the low-noise amplifier unit can be matched to the value of the charge injected by the capacitive pressure sensor. By improving the match of the charge injected via the feedback unit to the charge of the pressure sensor over the plurality of cycles, the difference in the injected charges can be reduced to zero, whereby directly linear behavior of the low-noise amplifier unit can be achieved, which in turn enables optimum amplification behavior of the low-noise amplifier unit.

According to one example embodiment of the present invention, the first integrator unit comprises a transconductor, wherein the second integrator unit comprises an operative transconductor amplifier.

In this way, it is possible to achieve the technical advantage that reliable, precise and low-noise amplifier behavior can be achieved via the transconductor of the first integrator unit and the operative transconductor amplifier of the second integrator unit.

According to one example embodiment of the present invention, the first integrator unit comprises a demodulator unit with a plurality of demodulator switching elements and at least one integrator capacitor element, wherein the first integrator unit is connected via the integrator capacitor element to the second integrator unit.

In this way, it is possible to achieve the technical advantage of enabling improved and low-noise amplification behavior of the first integrator unit and of the second integrator unit connected thereto. The boxcar integration technique can be carried out by way of the demodulator unit and the plurality of demodulator switching elements.

According to one example embodiment of the present invention, the analog front-end architecture furthermore comprises a multiplexer unit connected to the low-noise amplifier unit, wherein sensor signals of a temperature sensor are injectable via the multiplexer unit into the analog front-end architecture.

In this way, it is possible to achieve the technical advantage that both sensor signals from the capacitive pressure sensor and sensor signals from an additional temperature sensor can be amplified and processed by the analog front-end architecture. The analog front-end architecture thus enables simultaneous processing of different sensor signals, so enabling improved measuring behavior of the capacitive pressure sensor. By taking account of the sensor signals from the temperature sensor, it is thus possible to effect compensation of the pressure sensor values of the capacitive pressure sensor. This increases the applicability of the analog front-end architecture according to the present invention.

According to one example embodiment of the present invention, the analog front-end architecture furthermore comprises a double sampling unit with a plurality of sampler switching elements, wherein the polarity between output terminals of the capacitive pressure sensor and input terminals of the low-noise amplifier unit is swappable via the double sampling unit.

In this way, it may be possible to achieve a technical advantage that residual offsets of the low-noise amplifier unit can be reduced via double sampling by the double sampling unit. This boosts the measuring accuracy of the pressure or temperature sensors or the accuracy of the output signals output by the analog front-end architecture.

According to one example embodiment of the present invention, the analog front-end architecture is operable continuously or with a configurable power-duty cycle.

In this way, it may be possible to achieve the technical advantage that increased applicability of the analog front-end architecture is enabled by its being operable both continuously and with an individually configurable power-duty cycle.

According to one example embodiment of the present invention, the analog front-end architecture is compatible with a capacitive MEMS pressure sensor, in particular with a capacitive MEMS pressure sensor with a full-capacitive Wheatstone bridge or with a half-capacitive Wheatstone bridge or with a single active capacitance and with or without a reference capacitance.

In this way, it may be possible to achieve the technical advantage that an analog front-end architecture can be provided with the broadest possible applicability.

Exemplary embodiments of the present invention are explained with reference to figures.

DETAILED DESCRIPTION OF EXAMPLE EMBODIMENTS

Figure 1:
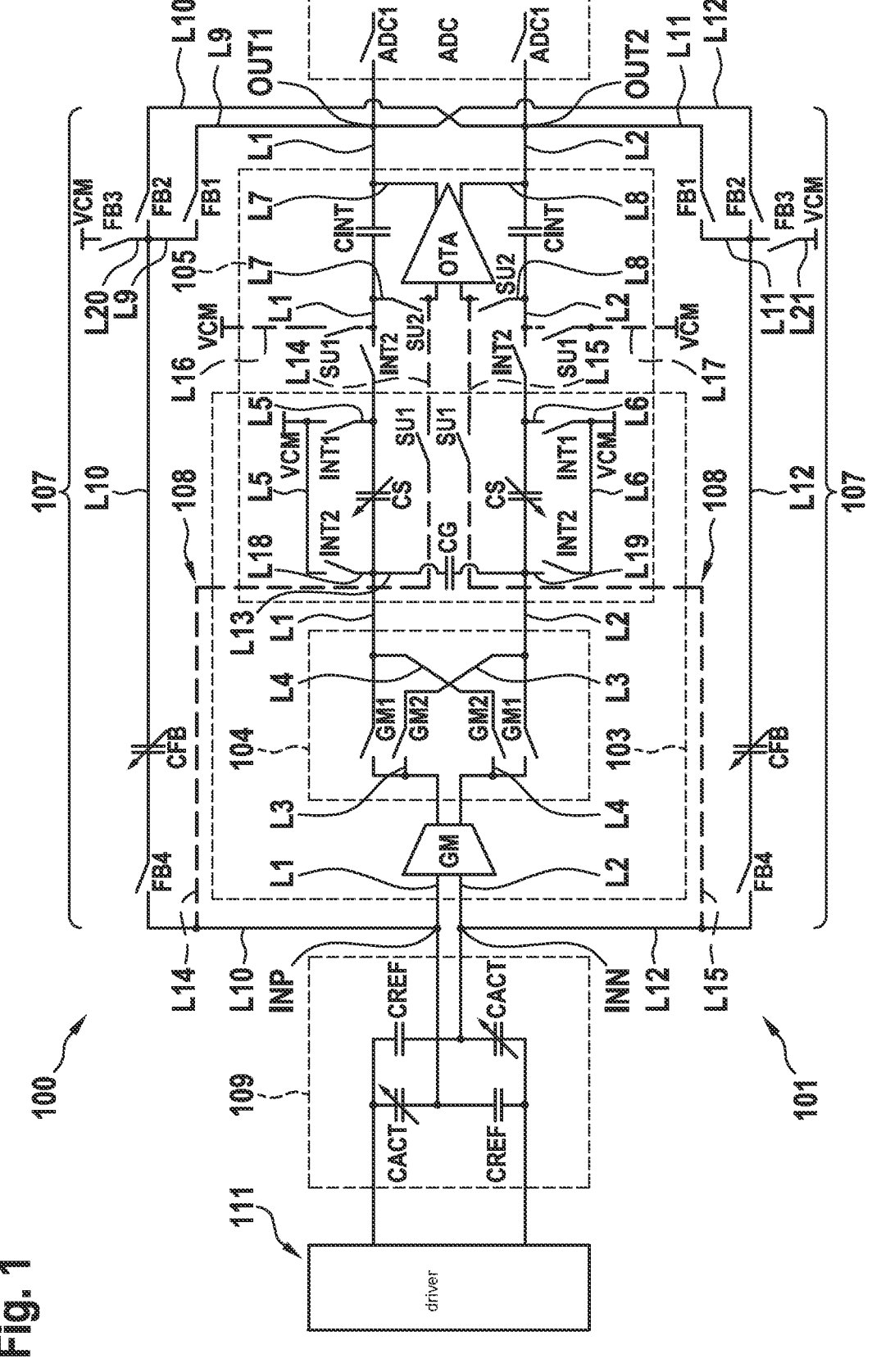
FIG. 1 is a schematic representation of an analog front-end architecture according to one embodiment of the present invention.

FIG. 1 is a schematic representation of an analog front-end architecture 100 according to one embodiment.

In the embodiment shown, the analog front-end architecture 100 comprises a low-noise amplifier unit 101. The low-noise amplifier unit 101 comprises a first integrator unit 103 configured as a boxcar integrator and a second integrator unit 105. The analog front-end architecture 100 is furthermore configured in a closed loop architecture and comprises a feedback unit 107.

In the embodiment shown, the first integrator unit 103 comprises a transductor GM and a demodulator unit 104, an integrator capacitor element CG and a first integrator capacitor element CS. The second integrator unit 105 furthermore comprises an operative transconductor amplifier OTA which takes the form of a switchable capacitance integrator.

In the embodiment shown, the analog front-end architecture 100 is connected to a capacitive pressure sensor 109 which is connected via first and second input terminals INP, INN to the analog front-end architecture 100. The capacitive pressure sensor 109 is controlled via a driver 111. The capacitive pressure sensor 109 is constructed as a capacitive Wheatstone bridge and comprises two sensor capacitor elements CACT and two reference capacitor elements CREF.

In the analog front-end architecture 100, the low-noise amplifier unit 101 is furthermore connected via first and second output terminals OUT1, OUT2 to an analog-to-digital converter ADC. The analog-to-digital converter ADC furthermore comprises two converter switching elements ADC1.

The transconductor GM is connected via a first line L1 to the first input terminal INP and via a second line L2 to the second input terminal INN. The demodulator unit 104 is connected via the first line L1 and the second line L2 to both the transconductor GM and the first integrator capacitor element CS, as well as, via the first integrator capacitor element CS, to the operative transconductor amplifier OTA of the second integrator unit 105. The operative transconductor amplifier OTA is connected via the first line L1 to the first output terminal OUT1 and via the second line L2 to the second output terminal OUT2 of the low-noise amplifier unit 101 of the analog front-end architecture 100.

The demodulator unit 104 comprises two first demodulator switching elements GM1 which are arranged in the first line L1 and the second line L2 respectively. The demodulator unit 104 furthermore comprises two second demodulator switching elements GM2 which are arranged in a third line L3 and a fourth line L4 respectively. The third line L3 and the fourth line L4 here provide a cross-connection between the first line L1 and the second line L2.

The second integrator unit 105 furthermore comprises two first integrator capacitor elements CS and two second integrator capacitor elements CINT which are in each case arranged in pairs in the first line L1 and the second line L2. The operative transconductor amplifier OTA is connected via a seventh line L7 and an eighth line L8 to the first line L1 and the second line L2 respectively, wherein the seventh line L7 has two interconnection points with the first line L1, and wherein the eighth line L8 has two interconnection points with the second line L2. The second integrator capacitor elements CINT are respectively arranged between the two interconnection points of the seventh line L7 with the first line L1 and of the eighth line L8 with the second line L2.

The first integrator unit 103 and the second integrator unit 105 are in each case connected via an integrator capacitor element CG. The integrator capacitor element CG is arranged in a thirteenth line L13 which provides a connection between the first line L1 and the second line L2.

A first integrator switching element INT1 is furthermore connected via a fifth line L5 to the first line L1 and to a common-mode voltage VCM. An eighteenth line L18 provides a connection between the first line L1 and the fifth line L5 and comprises a second integrator switching element INT2. A further first integrator switching element INT1 is furthermore connected via a sixth line L6 to the second line L2 and to the common-mode voltage VCM. A nineteenth line L19 provides a connection between the second line L2 and the sixth line L6 and comprises a second integrator switching element INT2. A first integrator capacitor element CS is arranged in the first line L1 between the interconnection points of the first line L1 with the fifth line L5 and the eighteenth line L18 and a further first integrator capacitor element CS is arranged in the second line L2 between the interconnection points of the second line L2 with the sixth line L6 and the nineteenth line L19.

The feedback unit 107 comprises a tenth line L10, which provides a connection of the second output terminal OUT2 to the first input terminal INP, and a twelfth line L12, which provides a connection between the first output terminal OUT1 and the second input terminal INN. The feedback unit

107 furthermore comprises a ninth line L9, which provides a connection between the first output terminal OUT1 and the tenth line L10, and an eleventh line L11, which provides a connection between the second output terminal OUT2 and the twelfth line L12. In the tenth line L10, the feedback unit 107 furthermore has a second feedback switching element FB2, a fourth feedback switching element FB4 and a feedback capacitor element CFB. In the twelfth line L12, the feedback unit 107 similarly has a second feedback switching element FB2, a fourth feedback switching element FB4 and a feedback capacitor element CFB. The fourth feedback switching elements FB4 are in each case arranged between the feedback capacitor element CFB and the input terminal INP, INN. Furthermore, a first feedback switching element FB1 is arranged in the ninth line L9 and the eleventh line L11 respectively. The feedback unit 107 moreover has a twentieth line L20 and a twenty-first line L21, wherein the twentieth line L20 provides a connection between the tenth line L10 and a further common-mode voltage VCM and has a third feedback switching element FB3, and wherein the twenty-first line L21 provides a connection between the twelfth line L12 and a further common-mode voltage VCM and has a third feedback switching element FB3.

After a plurality of switching cycles both of the first integrator unit 103 and of the second integrator unit 105, the charges injected via the feedback unit 107 into the input terminals of the low-noise amplifier unit 101 perfectly compensate the charges of the capacitive pressure sensor 109 likewise injected into the inputs. It is furthermore possible to suppress a negative influence of the high-frequency sampling of the analog-to-digital converter ADC via the fourth feedback switching elements FB4 while the feedback unit 107 is connected via the feedback capacitor element CFB to input or output terminals INP, INN, OUT1, OUT2. By way of the first to third feedback switching elements FB1, FB2, FB3, the feedback via the feedback unit 107, i.e. injection of the fed-back charge into the input terminals of the analog front-end architecture 100, can be matched to the boxcar integration clocking. The feedback unit 107 here acts as a modulator for the charge injected by the feedback unit 107 into the input terminals of the low-noise amplifier unit 101.

The first integrator capacitor element CS and the feedback capacitor element CFB can in particular take the form of adjustable capacitors, whereby tuning of the individual switching and capacitor elements is enabled and optimum gain and optimum dynamic behavior can be achieved by the low-noise amplifier unit 101.

On the basis of the charges injected into the first and second input terminals INP, INN, the transconductor GM generates corresponding current values which are integrated over an integration time TG and correspondingly charge the integrator capacitor element CG and the first integrator capacitor element CS. At the end of the integration time TG, the charge of the first integrator capacitor element CS is discharged into the second integrator capacitor element CINT. The charge of the first integrator capacitor element CS is discharged by the second integrator unit 105 into the second integrator capacitor element CINT. In this way, it is possible to achieve appropriate integration of the signal charges of the pressure or temperature sensors. The integration time TG may be configured as desired via the corresponding switching behavior of the first and second demodulator switching elements GM1, GM2. The switching behavior of the first and second integrator switching elements INT1, INT2 or of the first to fourth feedback switching elements FB1, FB2, FB3, FB4 can be matched to the switching behavior of the first and second demodulator switching elements GM1, GM2. Moreover, the first integrator capacitor elements CS or the feedback capacitor elements CFB can be adapted in order to achieve optimum switching or integration behavior of the low-noise amplifier unit 101.

The discrete cycle gain L, which is in each case the gain in the voltage applied to the input terminals INP, INN per performed amplification cycle z, amounts to:

$$L(z) = \frac{CFB}{CACT + CREF + CFB} * \frac{Gm\hat{a}^{^{\mathrm{TM}}}TG}{CG + \dfrac{CS}{2}} * \frac{CS}{CINT} * \frac{z^{-1}}{1 - z^{-1}} = K_p \frac{z^{-1}}{1 - z^{-1}},$$

wherein CFB is the capacitance of the feedback capacitor elements, CACT the capacitance of the sensor capacitor elements, CREF the capacitance of the reference capacitor elements, Gm the transconductance of the transconductor, TG the integration time, CS the capacitance of the first integrator capacitor elements, CINT the capacitance of the second integrator capacitor elements and $K_p$ a definition which takes account of the capacitances, the integration time TG and the transconductance Gm.

In this connection, the discrete input-output transfer function $V_0$ amounts to:

$$V_0 = P_{in} * S_m \frac{V_d}{CFB} * K_p \frac{z^{-1}}{1 - z^{-1}(1 - K_p)},$$

wherein $P_{in}$ is the input pressure of the pressure sensor 109, $S_m$ the MEMS pressure sensitivity and $V_d$ the amplitude of the square-wave drive voltage.

For $K_p = 1$, the discrete input-output transfer function $V_0$ becomes a simple sample time delay:

$$V_0 = P_{in} * S_m \frac{V_d}{CFB} * K_p * z^{-1}$$

By setting the $K_p$ parameter at or close to a value of one, linear settling of the discrete amplification system of the low-noise amplifier unit 101 can be reduced to a minimum. For $0 < K_p < 1$, the system settles with a low-pass behavior without overshoot. For $1 < K_p < 2$, the system settles with overshoot and oscillation and diverges at $K_p > 2$.

Irrespective of the value of the parameter $K_p$, the charges injected abruptly into the input terminals INP, INN of the analog front-end architecture 100 on turning on the pressure sensor 109 and the associated voltage applied to the terminals can drive the amplification system into nonlinear behavior, whereby the settling of the amplifier system required for operating the analog front-end architecture 100 and for successfully amplifying the signal charges of the pressure sensor 109 is sensitively delayed. If the incoming charges of the signals from the pressure sensor 109 increase abruptly, this may result in the first integrator unit 103 in the form of a boxcar integrator departing from a dynamic range and setting of the boxcar integrator may be delayed. The negative feedback loop of the feedback unit 107 may thus optionally require a long time interval in order to accumulate the charge on the feedback capacitor element which is required to inject into the input terminals INP, INN the voltage which corresponds to or has the same value as the signal charges of the pressure sensor 109 injected into the input terminals INP, INN.

The low-noise amplifier unit 101 furthermore comprises a startup unit 108.

The startup unit 108 can accelerate settling or adjustment of the amplifier system on switching on of the pressure sensor 109 and the associated abrupt injection of signal charge into the input terminals INP, INN by switching the startup unit 108 into the first switching state, routing the charges injected into the input terminals INP, INN past first integrator unit 103, which is in the form of a boxcar integrator, and applying the charges directly to the second integrator unit 105 for integration.

Figure 2:
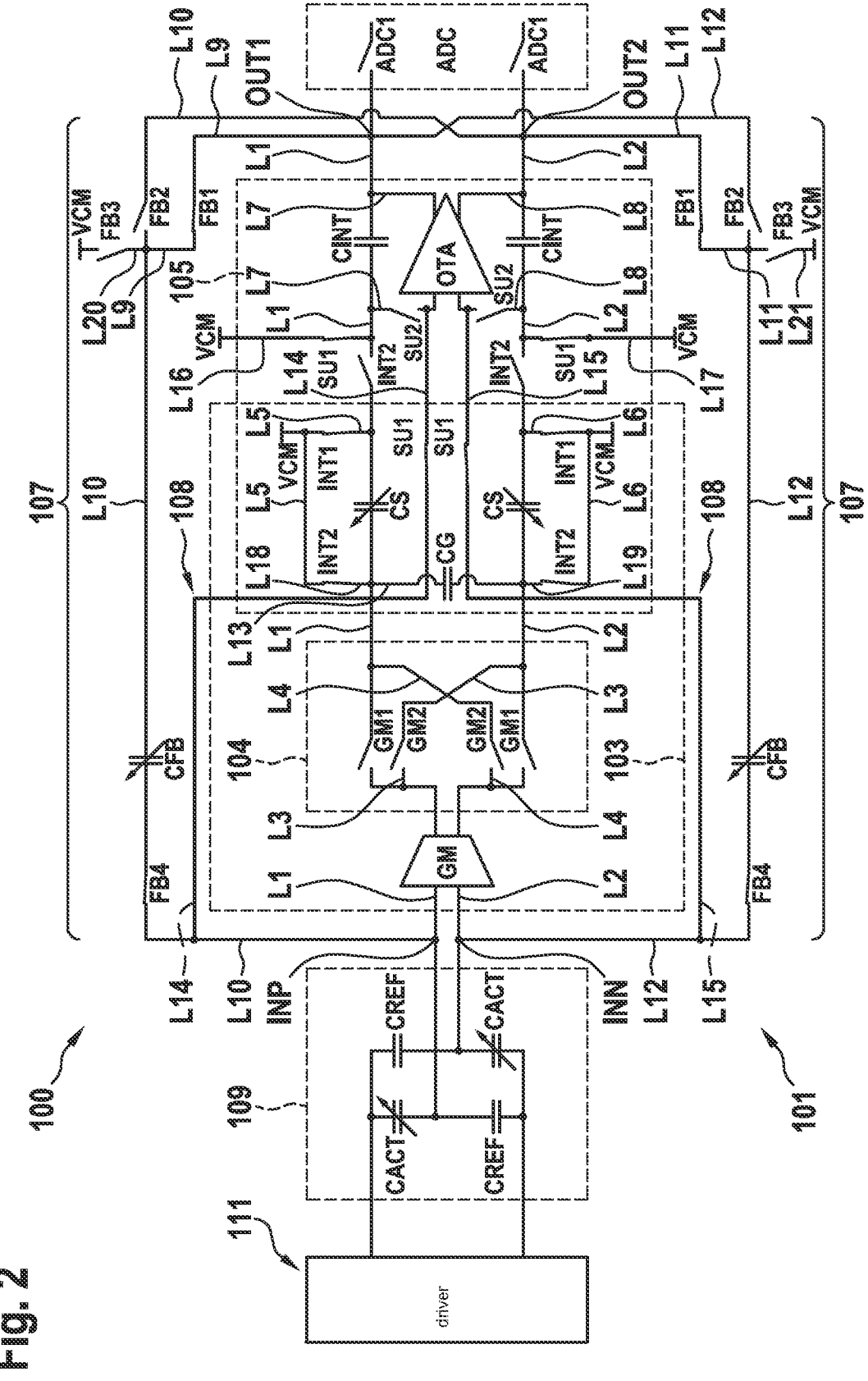
FIG. 2 is a further schematic representation of the analog front-end architecture in FIG. 1 in a further switching state.

The startup unit 108 is switchable between a first switching state and a second switching state. FIG. 1 shows the startup unit 108 in a second switching state, while FIG. 2 shows the startup unit 108 in a first switching state. In a first switching state, the startup unit 108 is configured to bypass the first integrator unit 103 and to introduce charges injected into the input terminals INP, INN of the low-noise amplifier unit 101 past the first integrator unit 103 into the second integrator unit 105, from which the charges are fed back via the feedback unit 107 and injected into the input terminals INP, INN. To this end, the startup unit 108 comprises a fourteenth line L14 and fifteenth line L15, wherein the fourteenth line L14 provides a connection between the tenth line L10 and the seventh line L7 of the second integrator unit 105, while the fifteenth line L15 provides a connection between the twelfth line L12 and the eighth line L8 of the second integrator unit 105. The startup unit 108 furthermore comprises two first startup switching elements SU1 and two second startup switching elements SU2. A first startup switching element SU1 is arranged in the fourteenth line L14, while a second first startup switching element SU1 is arranged in the fifteenth line L15. A first second startup switching element SU2, on the other hand, is arranged in the seventh line L7 and a second second startup switching element SU2 is arranged in the eighth line L8. The startup unit 108 moreover comprises a sixteenth line L16, which provides a connection of the first line L1 to a common-mode voltage VCM, and a seventeenth line L17, which similarly provides a connection between the second line L2 and a further common-mode voltage VCM. In turn, two first startup switching elements SU1 are arranged in the sixteenth line L16 and the seventeenth L17.

FIG. 1 shows the startup unit 108 in a second switching state, in which the first and second startup switching elements SU1, SU2 are in an open state. A direct connection between the input terminals INP, INN and the second integrator unit 105 via the startup unit 108 is thus not possible.

FIG. 2 shows a schematic representation of the analog front-end architecture 100 in a further switching state.

FIG. 2 shows the analog front-end architecture 100 from FIG. 1, wherein the startup unit 108 is in the first switching state in FIG. 2. To this end, the first startup switching elements SU1 in the fourteenth and fifteenth lines L14, L15 are set to a closed state. This enables a direct connection between the input terminals INP, INN and the second integrator unit 105 via the startup unit 108. The first startup switching elements SU1 in the sixteenth and seventeenth lines L16, L17 are moreover set to a closed state, whereby a connection is made between the first and second lines L1, L2 and the common-mode voltage VCM. Closing the first startup switching elements SU1 in the fourteenth and fifteenth lines L14, L15 bypasses the first integrator unit 103 such that the charge injected into the input terminals INP, INN is integrated by the second integrator unit 105. The feedback capacitor elements CFB are here used as integration capacitors instead of the second integrator capacitor elements CINT.

Capacitive pressure sensors, for example for measuring atmospheric pressures, are usually not operated continuously due to the small changes in atmospheric pressure, but in a clocked operating pattern in which the pressure sensor is alternately switched from a standby mode to an operating mode. On switching the pressure sensor from the standby mode into the operating mode, in which the pressure sensor passes through a measurement phase and records a plurality of measured values, the charge injected into the input terminals INP, INN of the low-noise amplifier unit 101 and, consequently, the applied voltage increase abruptly. The abrupt increase in voltage at the input terminals INP, INN may bring about nonlinear amplification behavior of the first and second integrator units 103, 105, in which an uncontrolled transient response of the first and second integrator units 103, 105 may be caused. In particular, the first integrator unit 105, which is operated as a boxcar integrator and thus cyclically, may exhibit, due to the abrupt increase in charges of the signals from the pressure sensor 109 injected into the input terminals INP, INN, a nonlinear transient response in which settling or adjustment of the integrator unit may be sensitively delayed. As a result, optimum amplification behavior of the low-noise amplifier unit 101 may be delayed.

The startup unit 108 can thus be switched into the first switching state in order to reduce the time required for the first and second amplifier units 103, 105 to settle on switching of the pressure sensor 109 from standby mode into operating mode. To this end, the first startup switching elements SU1 in the fourteenth and fifteenth lines L14, L15 and the first startup switching elements SU1 in the sixteenth and seventeenth lines L16, L17 are set to a closed switching state. Moreover, the first feedback switching elements FB1 in the ninth line L9 and in the eleventh line L11 are likewise set to a closed switching state. This enables a direct connection between the input terminals INP, INN and the second integrator unit 105. The charges of the pressure sensor 109 injected into the input terminals INP, INN are thus directly introduced into the second integrator unit 105 past the first integrator unit 103, such that the charge signals of the pressure sensor 109 are not integrated by the first integrator unit 103. The charges of the pressure sensor 109 are then integrated by the second integrator unit 105 and forwarded to the feedback unit 107 via the ninth and eleventh lines L9, L11.

Moreover, the fourth feedback switching elements FB4 in the tenth line L10 and in the twelfth line L12 are likewise set to a closed switching state. During ongoing pressure measurements of the pressure sensor 109, further charges are injected into the input terminals INP, INN by the pressure sensor 109. If the reinjected charges deviate from the previously injected charges, the feedback unit 107 matches the charges injected into the input terminals INP, INN by the feedback unit 107 in order to reduce the differences between the input terminals INP, INN to zero.

This process can be continued by switching the startup unit 108 into the first switching state and bypassing the first integrator unit 103 until the voltage applied to the input terminals INP, INN has reached a predetermined value which corresponds, for example, to the optimum operating range of the low-noise amplifier unit 101.

Once this voltage difference value has been reached, the startup unit 108 can be switched into the second switching state, in which the first and second startup switching elements SU1 and SU2 are set to an open switching state. On opening the first and second startup switching elements SU1 and SU2 for switching the startup unit 108 into the second switching state, the first feedback switching elements FB1 and optionally the fourth feedback switching elements FB4 are likewise switched into the open switching state. Ramping up of the sensor or the startup phase of the analog front-end architecture 100 is thus complete and further signal charges of the pressure sensor 109 based on further pressure measurements in subsequent measurement cycles are routed from the input terminals INP, INN directly into the first integrator unit 103 and then onward into the second integrator unit 105. The low-noise amplifier unit 101 can thus carry out the boxcar integration technique to carry out optimum amplification of the signal charges of the pressure sensor 109. The previously carried out startup phase, in which the first integrator unit 103 is bypassed, can accelerate settling of the first and second integrator units, and in particular of the clocked first integrator unit 103 in the form of a boxcar integrator, such that precise and low-noise amplification of the sensor signals from the pressure sensor 109 is enabled after just a small number of measurement or amplification cycles.

Figure 3:
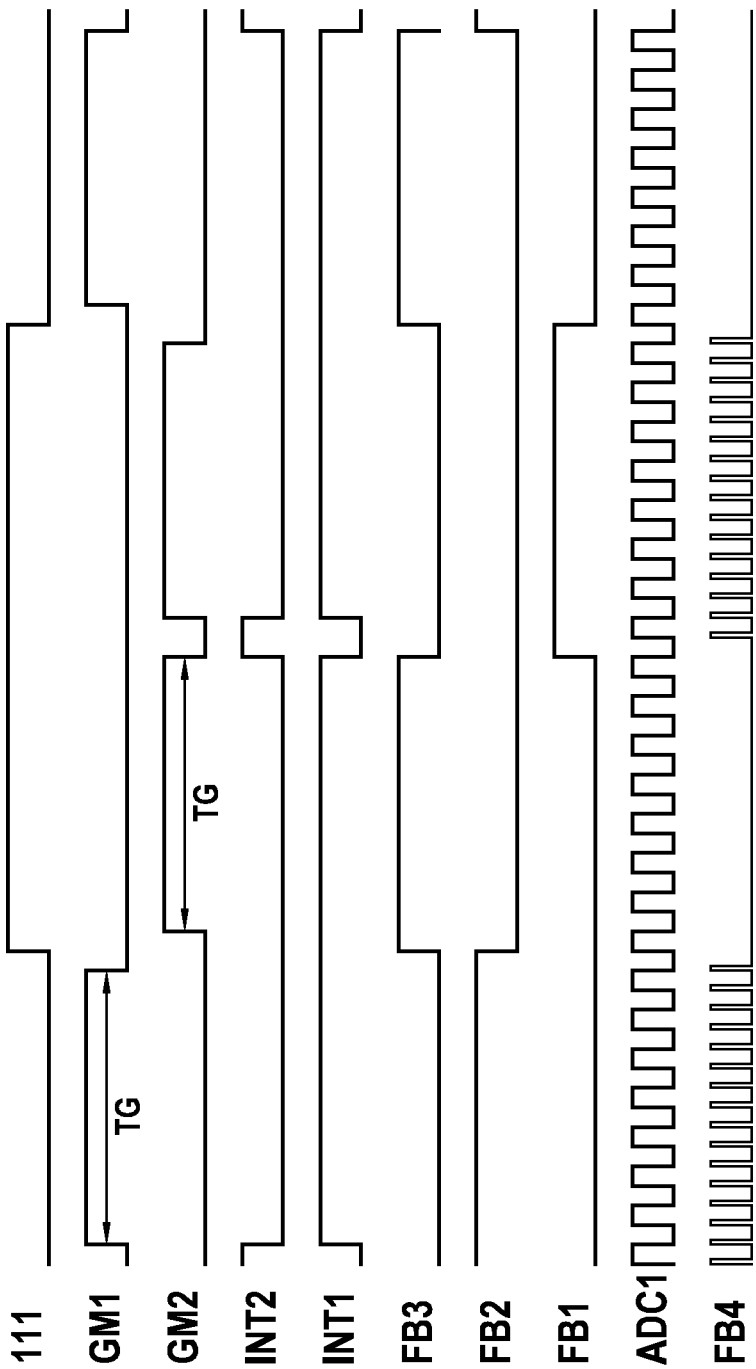
FIG. 3 is a schematic representation of a switching behavior of the analog front-end architecture according to a further embodiment of the present invention.

FIG. 3 is a schematic representation of a timing diagram of a clocking scheme of the analog front-end architecture 100 according to a further embodiment.

FIG. 3 shows the switching behavior of the driver 111, of the first and second demodulator switching elements GM1, GM2, of the first and second integrator switching elements INT1, INT2, of the first to fourth feedback switching elements FB1, FB2, FB3, FB4 and of the converter switching element ADC1. Appropriate switching of the first and second demodulator switching elements GM1, GM2 and of the first and second integrator switching elements INT1, INT2 means that the first integrator unit 103 can achieve boxcar integration of the charge of the sensor signals from the capacitive pressure sensor 109 injected into the first and second input terminals INP, INN. Appropriate switching of the first to third feedback switching elements FB1, FB2, FB3 means that the respective feedback of the feedback unit 107, in which integrated charges of the second integrator unit 105 are injected back into the input terminals of the analog front-end architecture 100, can be matched and modulated to the amplification behavior according to the boxcar integration technique. The fourth feedback switching element FB4 can reduce or suppress a negative influence of the high-frequency sampling of the analog-to-digital converter ADC, which is achieved by appropriate switching of the converter switching elements ADC1, by matching the switching pattern of the fourth feedback switching elements FB4 to the switching pattern of the converter switching elements ADC1 of the high-frequency sampling of the analog-to-digital converter ADC. In particular, the fourth feedback switching elements FB4 must be opened for a short time interval when the converter switching elements ADC1 sample the output signals of the low-noise amplifier unit 101 while the feedback unit 107 is connected via the feedback capacitor element CFB to the input and output terminals INP, INN, OUT1, OUT2.

The switching behavior shown here of the illustrated switching elements is merely exemplary in nature and only describes the theoretical and not the real switching behavior of the analog front-end architecture 100 according to the present invention.

Figure 4:
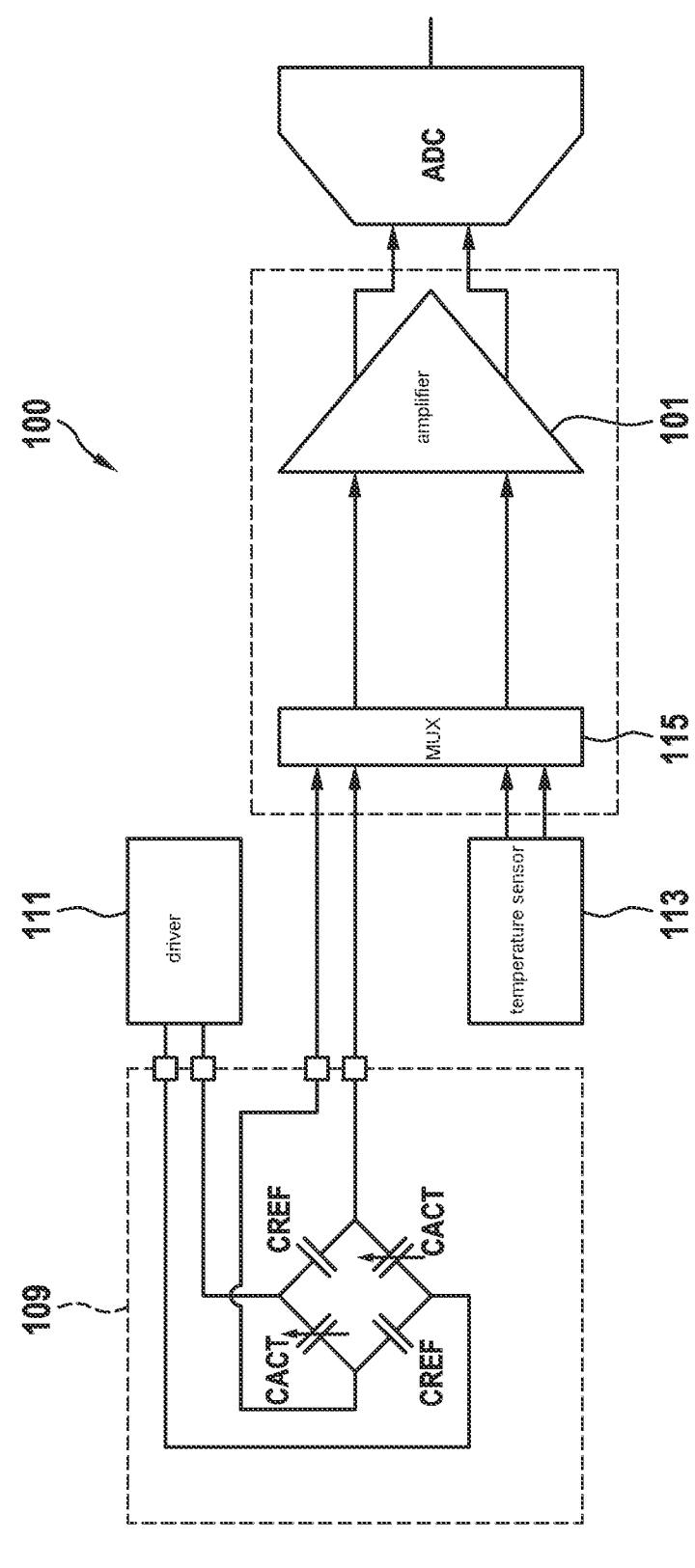
FIG. 4 is a further schematic representation of the analog front-end architecture according to a further embodiment of the present invention.

FIG. 4 is a further schematic representation of the analog front-end architecture 100 according to a further embodiment.

FIG. 4 is a simplified representation of one embodiment of the analog front-end architecture 100 in FIG. 1 and FIG. 2. The details of the analog front-end architecture 100 shown in FIG. 1 and FIG. 2 are not shown in FIG. 4 and the components of the analog front-end architecture 100 in FIG. 4 are limited solely to the low-noise amplifier unit 101. In the embodiment of FIG. 4, the low-noise amplifier unit 101 may comprise all the components shown in FIG. 1.

In the embodiment shown, the analog front-end architecture 100 and in particular the low-noise amplifier unit 101 is connected similarly to FIG. 1 to a capacitive pressure sensor 109 and an analog-to-digital converter ADC. The capacitive pressure sensor 109 is in turn connected to a driver 111 and takes the form of a capacitive Wheatstone bridge with two sensor capacitor elements CACT and two reference capacitor elements CREF.

At variance with the embodiment in FIG. 1, in the embodiment shown the analog front-end architecture 100 furthermore comprises a multiplexer unit 115. The analog front-end architecture 100 is moreover connected to a temperature sensor 113. In the embodiment shown, the sensor signals from the capacitive pressure sensor 109 and the sensor signals from the temperature sensor 113 are input into the multiplexer unit 115. By way of the multiplexer unit 115, both the sensor signals from the capacitive pressure sensor 109 and the sensor signals from the temperature sensor 113 can thus be sequentially amplified and appropriately processed by the analog front-end architecture 100. The sensor signals from the capacitive pressure sensor 109 and the sensor signals from the temperature sensor 113 are introduced as corresponding charge signals into the analog front-end architecture 100, wherein the charge signals of the capacitive pressure sensor 109 are proportional to the measured pressure and the charge signals of the temperature sensor 113 are proportional to the measured temperature. In particular if the temperature sensor acts, equivalently to a voltage source, proportionally to the absolute temperature, the signals of the temperature sensor can be converted into corresponding charges and injected into the input terminals.

Figure 5:
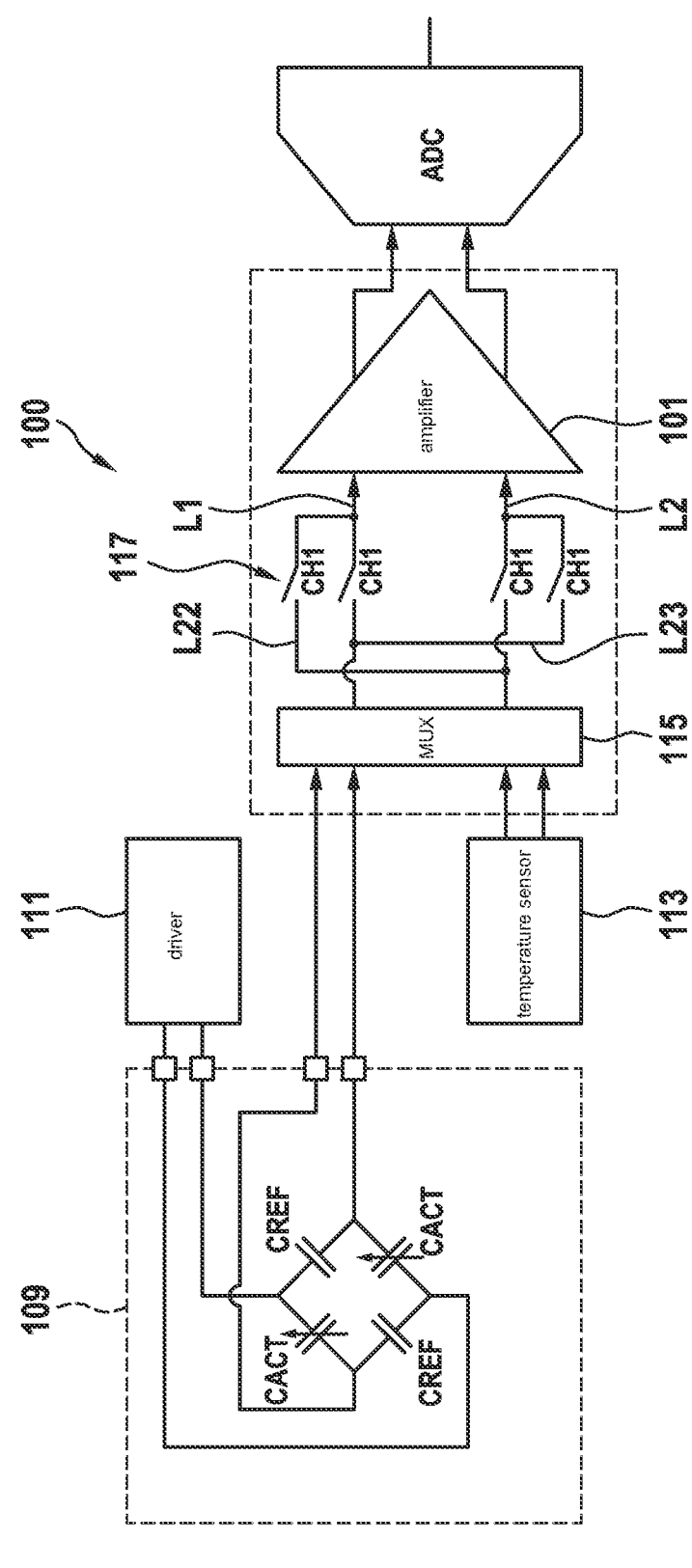
FIG. 5 is a further schematic representation of the analog front-end architecture according to a further embodiment of the present invention.

FIG. 5 is a further schematic representation of the analog front-end architecture 100 according to a further embodiment.

FIG. 5 is based on the embodiment in FIG. 4 and comprises all the features shown there. In FIG. 5, the analog front-end architecture 100 furthermore comprises a double sampling unit 117. The double sampling unit 117 is connected via the first line L1 and the second line L2 both to the low-noise amplifier unit 101 and to the multiplexer unit 115. The double sampling unit 117 comprises four sampler switching elements CH1, one of which switching elements is arranged in the first line L1 and one in the second line L2. A further sampler switching element CH1 is arranged in a twenty-second line L22, while the fourth sampler switching element CH1 is arranged in a twenty-third line L23. The twenty-second line L22 and the twenty-third line L23 in each case provide a cross-connection between the first and second lines L1, L2. Double sampling of the sensor signals from the capacitive pressure sensor 109 and of the sensor signals from the temperature sensor 113 can be carried out via the double sampling unit 117. During double sampling, the polarities of the respective sensor signals are in each case swapped for two successive sampling clock pulses. In this way, any residual offset of the analog front-end architecture 100 can be corrected by the correlated double sampling.

Figure 6:
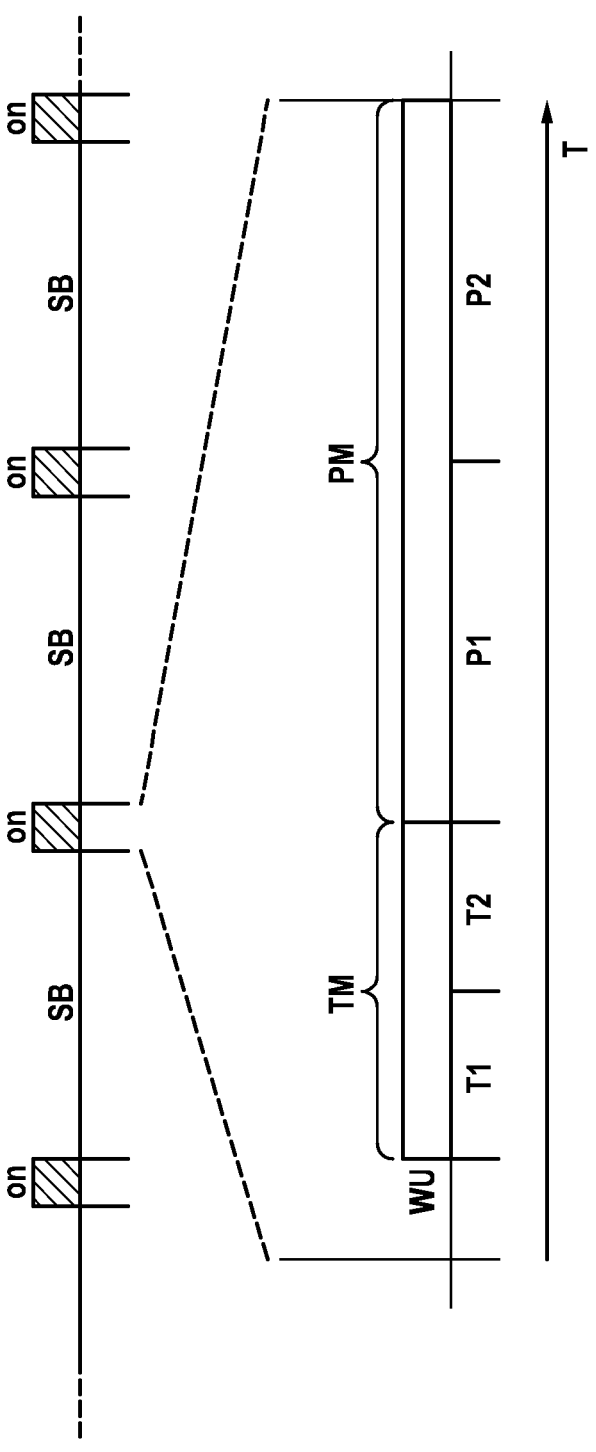
FIG. 6 is a schematic representation of a time sequence of a measurement behavior of a sensor system having the analog front-end architecture according to one embodiment of the present invention.

FIG. 6 is a schematic representation of a time sequence of a measurement behavior of a sensor system having the analog front-end architecture 100 according to one embodiment.

FIG. 6 shows a time sequence of measurement behavior of the analog front-end architecture 100 from FIG. 5 with double sampling of sensor signals from the capacitive pressure sensor 109 and sensor signals from the temperature sensor 113. In the embodiment in FIG. 5, both the capacitive pressure sensor 109 and the temperature sensor 113 can be operated in a clocked operating mode by alternately switching the sensors between a standby mode SB and a measurement phase ON. FIG. 6 shows the time sequence of the measurement behavior of the two sensors for a measurement phase ON. According to the embodiment shown, the measurement phase ON initially begins with a ramp-up phase WU, in which the pressure and temperature sensors or the analog front-end architecture 100 are started up in order to carry out a measurement. In the embodiment shown, a temperature measurement TM is then carried out first, followed by a pressure measurement PM. After completion of the pressure measurement PM, the pressure and temperature sensors are switched back to standby mode SB. In the embodiment shown, the temperature measurement TM comprises a first temperature measurement T1 and a second temperature measurement T2. The pressure measurement PM comprises a first pressure measurement P1 and a second pressure measurement P2. The first and second temperature measurements T1, T2 and the first and second pressure measurements P1, P2 are each recorded by the double sampling technique with different polarities such that the signals of the first temperature measurement T1 and the signals of the second temperature measurement T2 are of opposite polarity and the signals of the first pressure measurement P1 and the signals of the second pressure measurement P2 are of opposite polarity. By comparing the signals of the first and second temperature measurements T1, T2 or the signals of the first and second pressure measurements P1, P2, any residual offset of the analog front-end architecture 100 can be corrected by the correlated double sampling. The temperature and pressure measurements can here be carried out such that the two measurements do not interfere with one another. For example, temperature measurements can be carried out first. During the temperature measurement, the pressure sensor can likewise be actuated in order to make use of the temperature measurement time to set the pressure sensor to operating mode.

What is claimed is:

1. An analog front-end architecture for a capacitive pressure sensor, comprising:
  a low-noise amplifier unit configured for low-noise amplification of sensor signals from the capacitive pressure sensor, the low-noise amplifier unit including a first integrator unit and a second integrator unit configured to integrate charges injected into input terminals of the low-noise amplifier unit and to output integrated charges to output terminals of the low-noise amplifier unit, a feedback unit, and a startup unit, wherein the feedback unit is configured to reinject integrated charges from the second integrator unit into the input terminals of the low-noise amplifier unit, and wherein the startup unit is switchable between a first switching state and a second switching state and is configured, in the first switching state, to route the charges injected into the input terminals past the first integrator unit into the second integrator unit and from the second integrator unit into the feedback unit, and, in the second switching state, to route charges injected into the input terminals directly into the first integrator unit.

2. The analog front-end architecture as recited in claim 1, wherein the first integrator unit is a boxcar integrator and is configured to integrate the charges injected into the input terminals of the low-noise amplifier unit according to a boxcar integration technique.

3. The analog front-end architecture as recited in claim 1, wherein the feedback unit includes at least one feedback capacitor element, wherein the charges of the second integrator unit injected back into the low-noise amplifier unit are matchable via the feedback capacitor element to the injected charges of the capacitive pressure sensor connected to the input terminals of the low-noise amplifier unit.

4. The analog front-end architecture as recited in claim 1, wherein the first integrator unit includes a transconductor, and the second integrator unit includes an operative transconductor amplifier.

5. The analog front-end architecture as recited in claim 1, wherein the first integrator unit includes a demodulator unit with a plurality of demodulator switching elements and at least one integrator capacitor element, and the first integrator unit is connected via the integrator capacitor element to the second integrator unit.

6. The analog front-end architecture as recited in claim 1, further comprising a multiplexer unit connected to the low-noise amplifier unit, wherein sensor signals of a temperature sensor are injectable via the multiplexer unit into the analog front-end architecture.

7. The analog front-end architecture as recited in claim 1, further comprising a double sampling unit with a plurality of sampler switching elements, wherein a polarity between output terminals of the capacitive pressure sensor and the input terminals of the low-noise amplifier unit are swappable via the double sampling unit.

8. The analog front-end architecture as recited in claim 1, wherein the analog front-end architecture is operable continuously or with a configurable power-duty cycle.

9. The analog front-end architecture as recited in claim 1, wherein the analog front-end architecture is compatible with a capacitive MEMS pressure sensor including a capacitive MEMS pressure sensor with a full-capacitive Wheatstone bridge or with a half-capacitive Wheatstone bridge or with a single active capacitance, and with or without a reference capacitance.

* * * * *